US006972369B2

(12) United States Patent
Megason et al.

(10) Patent No.: US 6,972,369 B2
(45) Date of Patent: Dec. 6, 2005

(54) FLEXIBLE GROUNDING STRIP

(75) Inventors: George D. Megason, Spring, TX (US); Thomas T. Hardt, Missouri City, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 46 days.

(21) Appl. No.: 10/742,041

(22) Filed: Dec. 19, 2003

(65) Prior Publication Data

US 2005/0133236 A1 Jun. 23, 2005

(51) Int. Cl.[7] .............................................. H05K 5/02
(52) U.S. Cl. .......................... 174/51; 174/6; 174/35 C; 174/40 CC; 439/98; 361/753
(58) Field of Search .............................. 174/51, 59, 60, 174/6, 35 C, 135, 40 CC; 459/98, 92, 100; 361/753, 799

(56) References Cited

U.S. PATENT DOCUMENTS 4,762,966 A 8/1988 Kosanda
5,084,802 A 1/1992 Nguyenngoc
5,597,979 A 1/1997 Courtney et al.
6,116,924 A 9/2000 Laut
6,198,633 B1 3/2001 Lehman et al.
6,225,555 B1 * 5/2001 Sosnowski ............. 174/35 GC
6,349,041 B1 2/2002 Hayward et al.
6,403,879 B1 6/2002 Clements et al.
6,508,653 B2 1/2003 Malone et al.
6,613,976 B1 9/2003 Benn, Jr.
6,620,999 B2 9/2003 Pommerenke et al.

* cited by examiner

*Primary Examiner*—Dhiru R. Patel

(57) ABSTRACT

A flexible grounding strip includes elongated electrically conductive strip having a base extending between spaced, opposed sidewalls. At least one of the sidewalls has a flange spaced from the base and extending towards the opposed sidewall. Each of the sidewalls has a series of lengthwise-spaced slots extending widthwise across the sidewall into and at least partly across the base towards the opposed sidewall. The slot dimensions and spacing impart flexibility to enable the strip to bend transversely of its length.

19 Claims, 6 Drawing Sheets

FLEXIBLE GROUNDING STRIP

BACKGROUND

Electromagnetic interference (EMI) can create operational problems in many types of electronic devices, including computer systems. Proper grounding of components in these devices is therefore desirable to minimize the effect of EMI. Grounding is accomplished by providing a pathway for conducting electricity from a component to a grounding object of greater size, such as the chassis of the electronic device. It is therefore desirable to ensure that an electrical connection is maintained at the maximum number of interfaces between a component and the grounding object.

The design of some components does not always ensure a proper electrical connection at a given interface. In these instances, it is desirable to have a separate grounding device that may provide an electrical connection at the interface. The likelihood of providing an electrical connection at an interface is increased if the grounding device is flexible and can conform to the surfaces of the components that are connected. It is also sometimes desirable to install or remove components of an electronic device after the device has been assembled. It is therefore desirable to have a grounding device that can be easily installed or removed from an electronic device without requiring disassembly of the electronic device.

SUMMARY

The problems noted above are solved in large part by a flexible grounding strip comprising an elongated electrically conductive strip having a base extending between spaced, opposed sidewalls. At least one of the sidewalls has a flange spaced from the base and extending towards the opposed sidewall. Each of the sidewalls has a series of lengthwise-spaced slots extending widthwise across the sidewall into, and at least partly across, the base towards the opposed sidewall. The slot dimensions and spacing impart flexibility to enable the strip to bend transversely of its length.

BRIEF DESCRIPTION OF THE DRAWINGS

For a detailed description of embodiments, reference will now be made to the accompanying drawings in which.

DETAILED DESCRIPTION

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "electrical connection" (or variations thereof) is intended to mean either an indirect or direct electrical connection. Thus, if a first device is electrically connected to a second device, that connection may be through a direct electrical connection, or through an indirect electrical connection via other devices and connections.

The following discussion is directed to various embodiments. Although one or more of these embodiments may be preferred, the embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure is limited to that embodiment.

Figure 2:
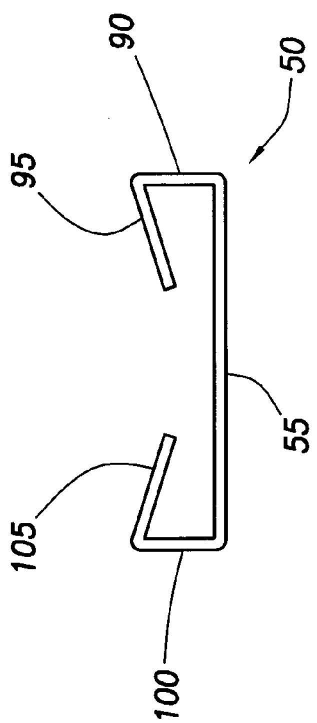
FIG. 2 illustrates a top view of the flexible grounding strip of FIG. 1.
Figure 1:
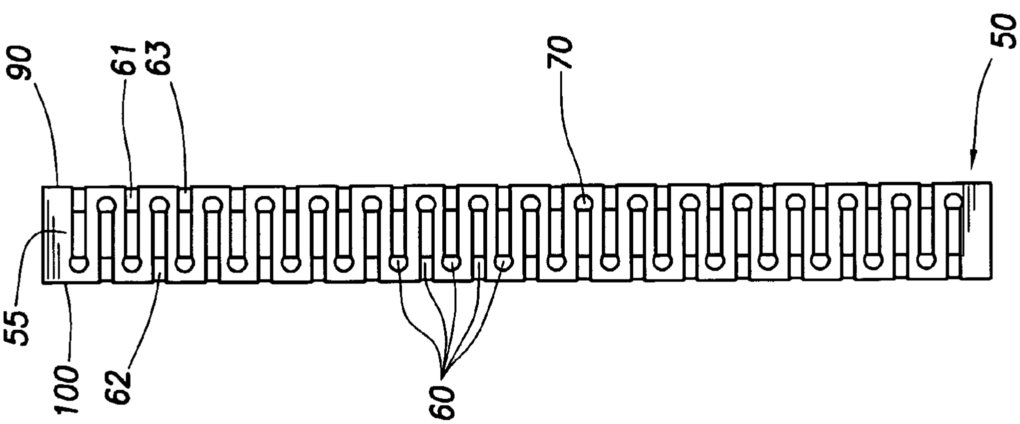
FIG. 1 illustrates a front view of a flexible grounding strip in accordance with embodiments of the invention.
Figure 3:
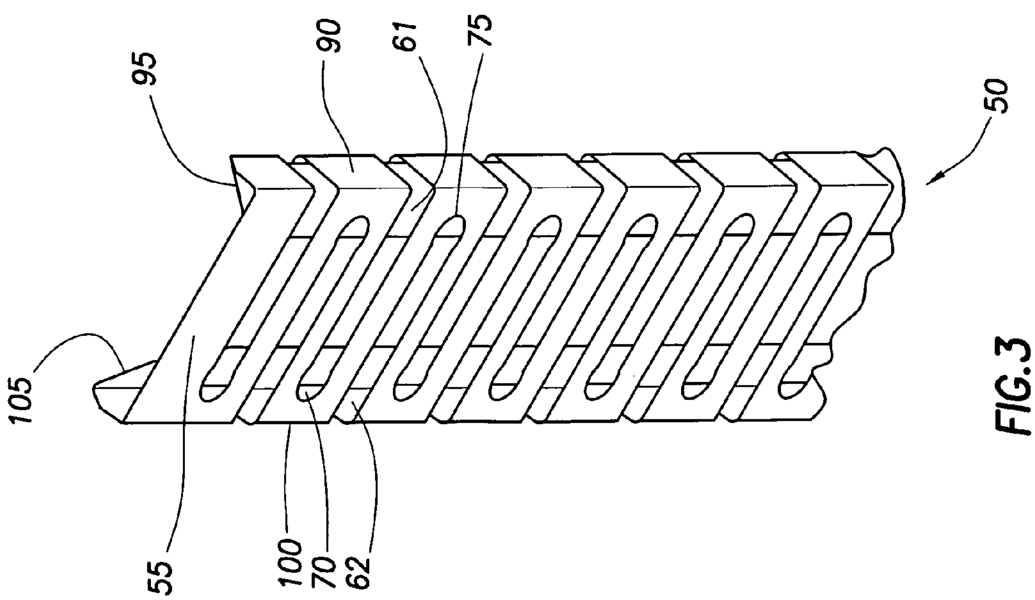
FIG. 3 illustrates a front perspective view of the flexible grounding strip of FIG. 1.

Referring now to FIGS. 1–3, a flexible grounding strip 50 is shown in accordance with an embodiment of the invention. Flexible grounding strip 50 is an elongated, electrically conductive channel strip having base 55, sidewall 90, sidewall 100, flange 95, and flange 105. Flange 95 is spaced from base 55 and extends towards sidewall 100 and base 55. Similarly, flange 105 is spaced from base 55 and extends towards sidewall 90 and base 55.

Flexible grounding strip 50 has a series of lengthwise-spaced slots 60 arranged so that an individual slot extends through the thickness of the strip and widthwise across a sidewall 90, 100. Slot 60 further extends into, and at least partly across, base 55 and terminates in a curved end 70. Slot 60 may also extend into flanges 95 or 105. The dimensions and spacing of slots 60 impart flexibility to enable flexible grounding strip 50 to bend transversely of its length during installation and to maintain contact with adjacent components after installation.

Slots 60 can be arranged so that alternating slots begin at opposite sidewalls 90 and 100. For example, slot 61 begins at sidewall 90, while slot 62 begins at sidewall 100 and slot 63 begins at sidewall 90. The alternating pattern is repeated throughout flexible grounding strip 50, with slots 60 extending across sidewalls 90 and 100. This alternating pattern provides sufficient flexibility for grounding strip 50 while minimizing stress concentrations that could cause permanent deformation of the strip during installation.

Figure 4:
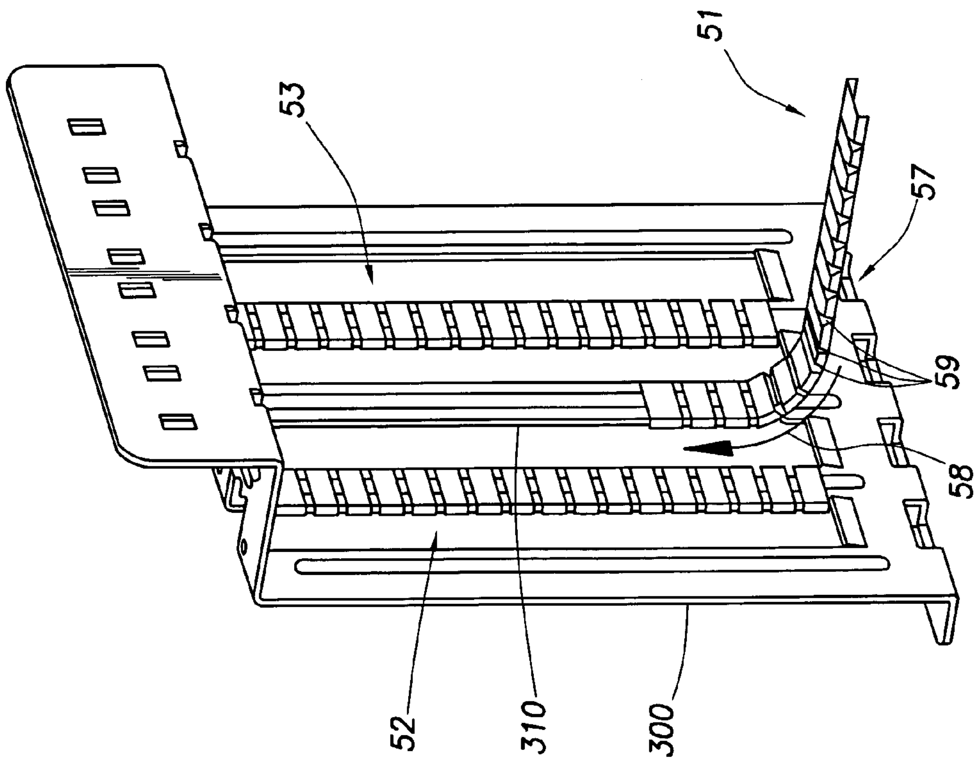
FIG. 4 illustrates a perspective view of a flexible grounding strip being installed on a component in accordance with embodiments of the invention.

Referring now to FIG. 4, a perspective view of a flexible grounding strip 51 is shown being installed on component 300. The slots 59 allow flexible grounding strip 51 to easily flex or bend transversely of its length during installation of flexible grounding strip 51 onto section, or rib, 310 of component 300. Flexible grounding strip 51 is installed from direction 57 that is generally perpendicular to rib 310, and flexes, or bends, in direction 58, to become parallel to rib 310. Flexible grounding strips 52 and 53 are shown after installation onto component 300 has been completed. Thus, the dimensions and spacing of slots 59 enable flexible grounding strips 51–53 to bend transversely of their length and be easily installed on rib 310.

Figure 5:
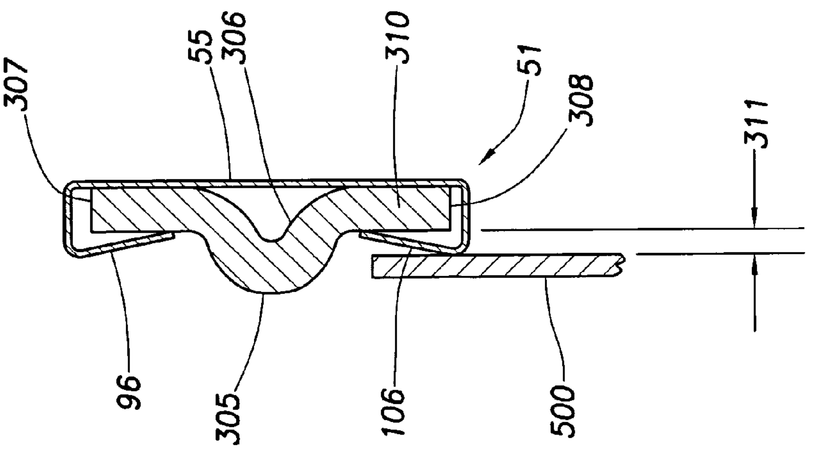
FIG. 5 illustrates a top sectional view of a flexible grounding strip installed on a rib in accordance with embodiments of the invention.
Figure 6:
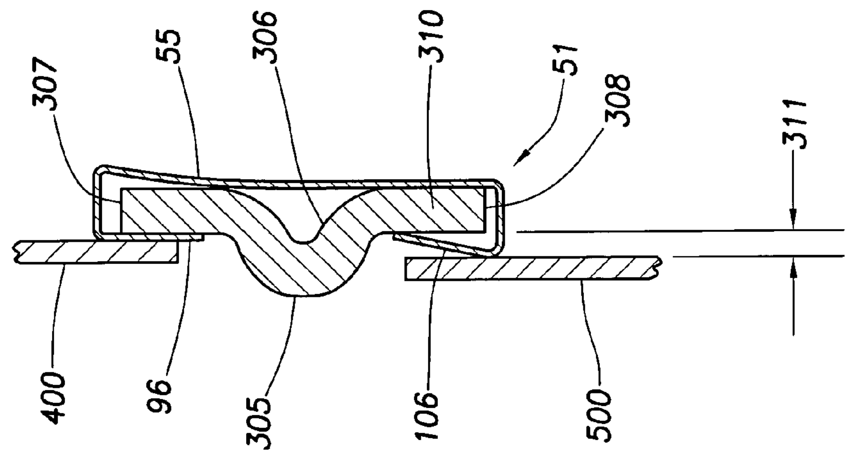
FIG. 6 illustrates a top view of a flexible grounding strip installed on a rib in accordance with embodiments of the invention.

Referring now to FIGS. 5 and 6, a top sectional view is shown of flexible grounding strip 51 installed on rib 310. These views show details of rib 310, including surfaces 305 and 306 connected by edges 307 and 308. Flexible grounding strip 51 includes base 55 and flanges 96 and 106. FIG. 5 shows flanges 96 and 106 contacting surface 305 of rib 310. Flanges 96 and 106 project toward base 55 such that the flanges will hold flexible grounding strip 51 in place on rib 310 without additional components being attached to the rib.

Flexible grounding strip 51 is constructed such that the distance between base 55 and the end of flanges 96, 106 is less than the thickness of rib 310 (i.e., the length of edges 307, 308). Therefore, flange 96 deflects as flexible grounding strip 51 is installed on rib 310 and maintains contact with the rib once installed. This allows flange 96 to retain flexible grounding strip 51 in place on rib 310 without additional components being attached or disposed adjacent to rib 310.

When installed on rib 310, flange 106 also deflects to engage surface 305 and projects a distance 311 above the surface. Component 500, when installed adjacent to rib 310 at a distance 311 or closer, will contact flexible grounding strip 51. The flexibility and cross-sectional shape of flexible grounding strip 51 allow flanges 96 and 106 to maintain contact with rib 310 whether or not component 500 is installed.

FIG. 6 shows additional component 400 disposed adjacent to, rib 310 such that there is a minimal gap, if any, between component 400 and rib 310. Flange 96 maintains contact with both component 400 and rib 310, while flange 106 maintains contact with both component 500 and rib 310. The flexibility of flexible grounding strip 51 helps to allow flanges 96 and 106 to maintain contact with components 400 and 500, respectively, when the components are installed at distance 311 or less. This contact is maintained despite the variation in distances between rib 310 and components 400 and 500. Further, if component 500 is disposed next to rib 310 such that the distance between component 500 and rib 310 varies along the length of rib 310, the flexibility of flexible grounding strip 51 allows flange 106 to maintain contact with rib 310 and component 500.

For purposes of example, components 400 and 500 are ungrounded components disposed adjacent to surface 305 of rib 310, which is grounded. Flexible grounding strip 51, rib 310, and components 400 and 500 are comprised of electrically conductive materials. Flexible grounding strip 51 is in contact with components 400 and 500 as well as rib 310 of component 300. Therefore, an electrical connection will be formed between grounded rib 310 and ungrounded components 400 and 500, such that components 400 and 500 will be properly grounded.

Figure 7:
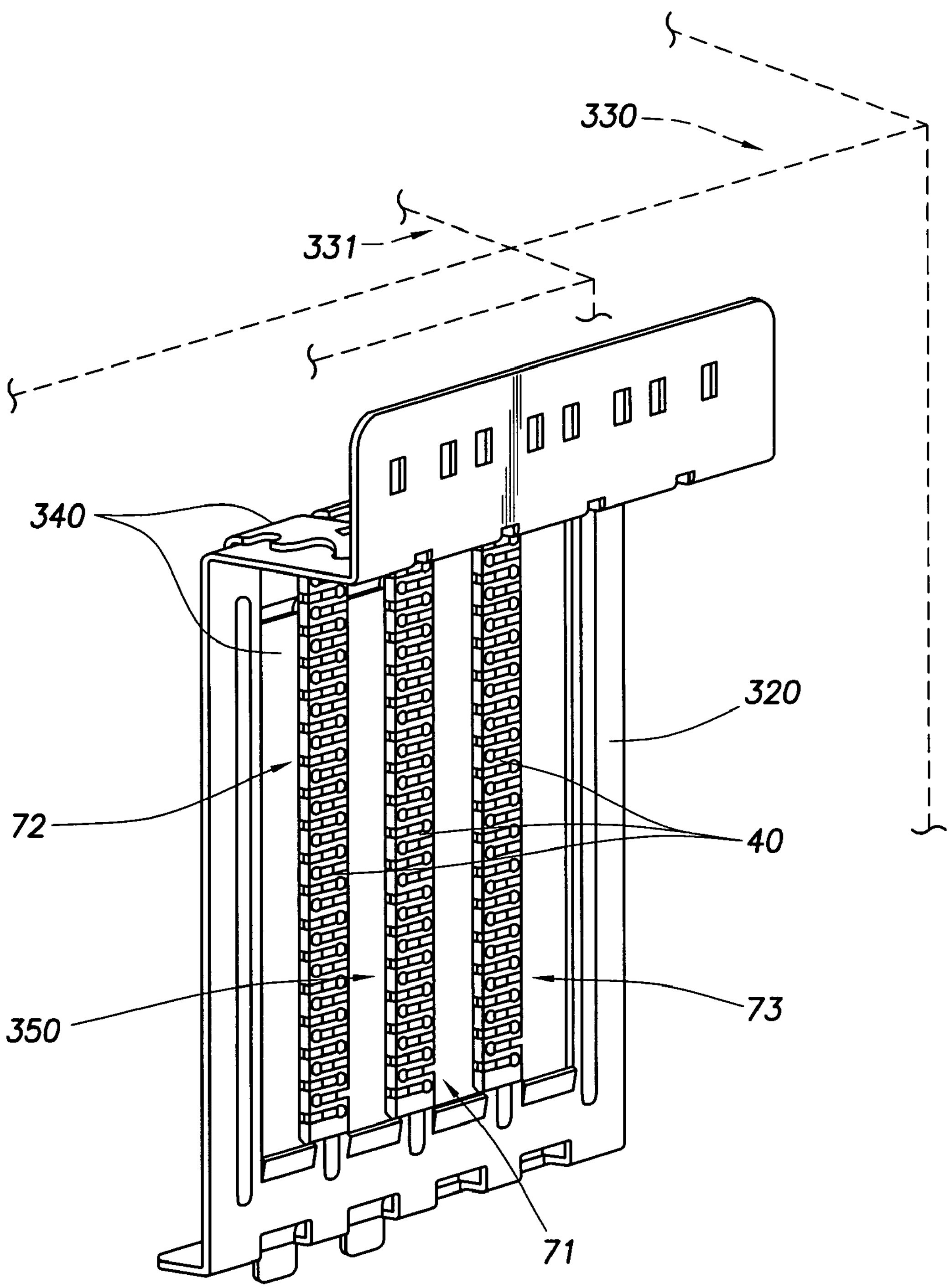
FIG. 7 illustrates a perspective view of flexible grounding strips installed on an input/output backplane in a computer system in accordance with embodiments of the invention.
Figure 9:
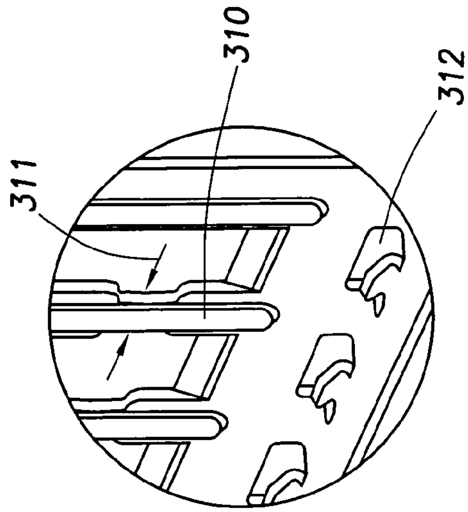
FIG. 9 illustrates a detailed view of features that can be incorporated into an input/output backplane in accordance with embodiments of the invention.
Figure 8:
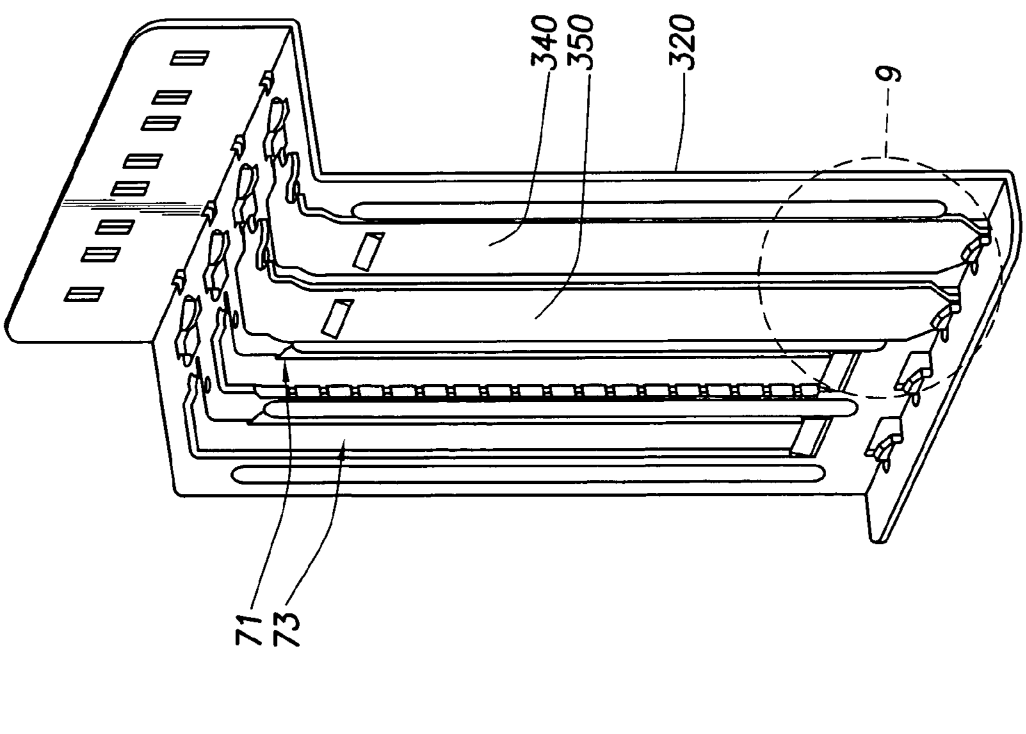
FIG. 8 illustrates a perspective view of flexible grounding strips installed on an input/output backplane in a computer system in accordance with embodiments of the invention.

Referring now to FIGS. 7–9, flexible grounding strips 71, 72, and 73 have been installed on input/output (I/O) backplane 320 in computer system 330 with component 331 or other source of electromagnetic interference (EMI). For purposes of illustration, slot blanks 340 and 350 are representative of any component 331 that is capable of being attached to I/O backplane 320. Component 331 may be a peripheral component interface board or other printed circuit board (not shown). Slot blanks 340 and 350 are shown here for simplicity and clarity in illustration and may be used in conjunction with I/O backplane 320 when component 331 is not present in computer system 330.

Flexible grounding strips 71–73, comprising lengthwise-spaced slots 40 to impart flexibility, are installed onto I/O backplane 320. Slot blanks 340 and 350 have been attached to I/O backplane 320 in such a manner that flexible grounding strips 71 and 72 are between, and in contact with, I/O backplane 320 and slot blanks 340 and 350. EMI generated by computer system 330 or component 331 may escape from computer system 330 if I/O backplane 320 and component 331, or slot blanks 340, 350, are not properly grounded. Flexible grounding strips 71 and 72 will permit slot blanks 340 and 350 to be properly grounded, in part due to slots 40 imparting flexibility to the flexible grounding strips 71 and 72. This flexibility provides proper grounded even if there are gaps of varying distances between I/O backplane 320 and slot blanks 340 and 350.

As shown in FIG. 9, a notch 311 may be cut into rib 310 to make installation of the flexible grounding strips 71–73 easier. Notch 311 provides an area of reduced width for rib 310 and allows a flexible grounding strip 71–73 to be installed onto rib 310 by inserting an end into notch 311 and sliding it up rib 310 in the manner shown in FIG. 4. In addition, slot 312 may be cut in the base of I/O backplane 320 to engage slot blanks 340 and 350 and control their position relative to the I/O backplane.

It should be noted that the flexible grounding strips 71–73 provide many benefits in grounding components such as I/O backplane 320 and any attached components, such as slot blanks 340 and 350. The extreme flexibility of the flexible grounding strips 71–73 may allow the installation of flexible grounding strips 71–73 onto I/O backplane 320 shown in FIG. 7 without removal of the I/O backplane 320 from computer system 330. Further simplifying installation of the flexible grounding strips 71–73 is the fact that no tools are needed to install the flexible grounding strips 71–73 onto I/O backplane 320.

In addition, any separation of the flexible grounding strips 51–53 from I/O backplane 320 or attached components will be limited to a small region due to the flexibility of flexible grounding strips 71–73. The flexible nature of flexible grounding strips 71–73 allows them to conform to the surface on which they are installed, thereby increasing the opportunity for providing an effective electrical connection and grounding mechanism. It should also be noted from the included Figures that flexible grounding strips 71–73 contain no sharp or exposed edges that would be likely to injure an individual who places his or her hands in proximity to flexible grounding strips 71–73.

Figure 10:
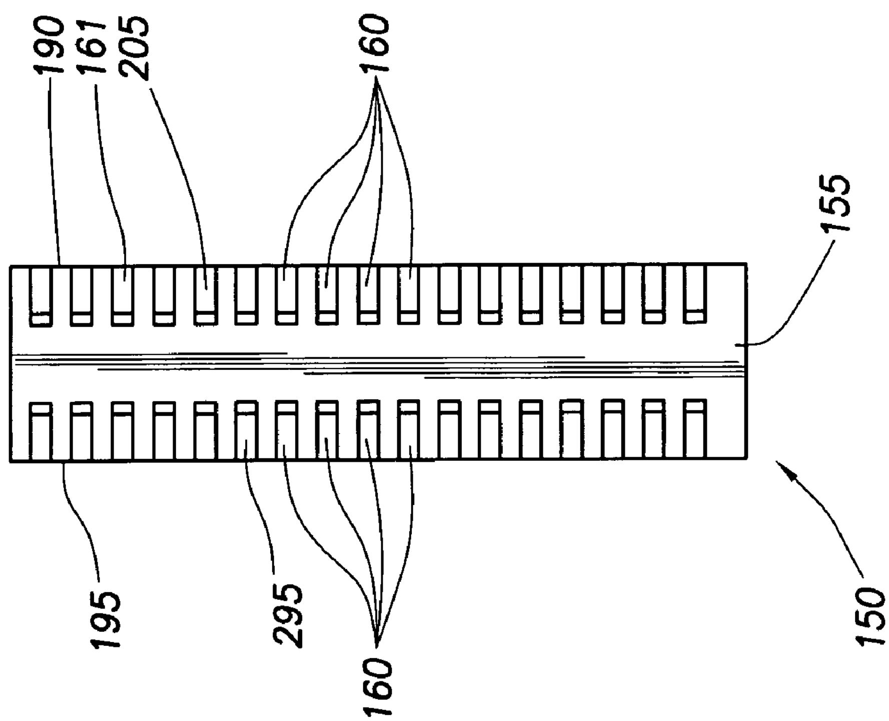
FIG. 10 illustrates a front view of a flexible grounding strip in accordance with embodiments of the invention.

The flexibility of the grounding strips may be due to several factors, including, but not limited to the thickness and material properties of the strip material, the number and arrangement of the slots through the strip, and the configuration of the sidewalls and flanges. For example, FIG. 10 shows a flexible grounding strip 150 comprising a base 155 and two opposing sidewalls 190 and 195. A series of lengthwise-spaced slots 160 are arranged so that an individual slot extends across either sidewall 190 or 195 and into, and at least partly across, base 155. Slots 160 are arranged so that a part of center portion of base 155 does not have slots 160 extending across it but grounding strip 150 can bend transversely of its length.

Figure 11:
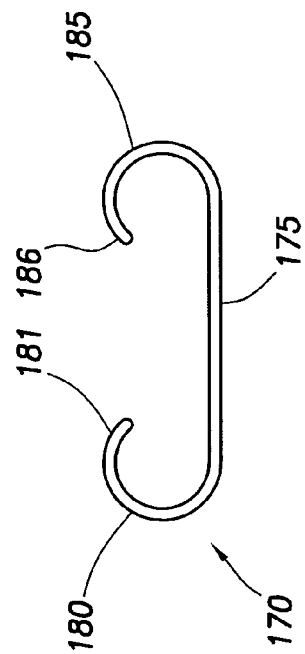
FIG. 11 illustrates a top view of a flexible grounding strip in accordance with embodiments of the invention.

The configuration of the sidewalls and flanges of a flexible grounding strip is also not limited. For example, in reference to FIG. 2, the angle between flanges 95 and 105 and sidewalls 90 and 100 may be varied. Further, and in reference to FIG. 11, flexible grounding device 170 comprises a base 175 disposed between curved portions 180 and 185 with ends 181 and 186. Curved portions 180 and 185 and ends 181 and 186 function similar to sidewalls 90 and 100 and flanges 95 and 105 of the embodiment of FIG. 2.

Figure 12:
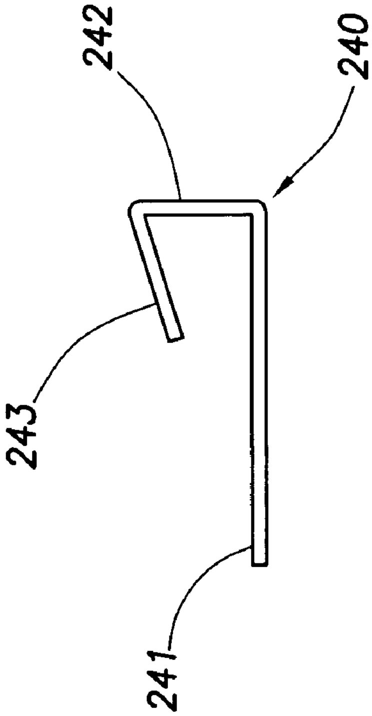
FIG. 12 illustrates a top view of a flexible grounding strip in accordance with embodiments of the invention.

Other embodiments of the invention may also incorporate only one sidewall and flange, as shown in FIG. 12. Flexible grounding device 240 comprises sidewall 242 disposed between base 241 and flange 243, which extends towards base 241. This one-flange embodiment may be utilized in situations where an embodiment with two sidewalls may not be used. For example, the outermost rib in an I/O backplane may have only one edge that is accessible. In addition, there may be situations where it is not possible to install a flexible grounding strip by sliding it along a rib, and in these instances, an embodiment with only one sidewall may be installed from the side of the rib and thereby provide effective grounding of adjacent components.

The embodiments described above may be produced by different methods of manufacturing. One such method uses a progressive die to perform the various steps needed to transform a strip of electrically conductive material into a flexible grounding strip. In this method, a strip of electrically conductive material is fed into the progressive die and transported across several stations. At each station, a separate die is used to perform a manufacturing step, such as removing or bending material. For example, the slots incorporated in the embodiments described above may be formed by stamping the strip of electrically conductive material with a die that produces the desired slot geometry. A separate die may be used to cut the strip into the desired external dimensions for the preferred flexible grounding strip. Finally, another die may be used to bend the material into the desired shape.

The above discussion is meant to be illustrative of the principles and various embodiments. Numerous variations and modifications will become apparent to those skilled in the art once the above disclosure is fully appreciated. For example, embodiments include alternative slot geometry and configurations from those described in the above discussion. It is intended that the following claims be interpreted to embrace all such variations and modifications.

What is claimed is:

1. A flexible grounding strip comprising:

an elongated, electrically conductive strip having a base extending between spaced, opposed sidewalls, at least one of the sidewalls having a flange spaced from the base and extending towards the opposed sidewall and the base such that the flange and the base contact a rib disposed therebetween;

each of the sidewalls having a series of lengthwise-spaced slots extending widthwise across the sidewall into and at least partly across the base towards the opposed sidewall;

the slot dimensions and spacing imparting flexibility to enable the strip to bend transversely of its length.

2. The flexible grounding strip according to claim 1, wherein:

the base, sidewalls and flange comprise a one-piece strip.

3. The flexible grounding strip according to claim 1, wherein:

at least one of the series of lengthwise-spaced slots comprises a curved end.

4. The flexible grounding strip according to claim 1, wherein:

the series of lengthwise-spaced slots are arranged so that slots extending at least partly across the base from one sidewall are disposed between slots extending at least partly across the base from the opposed sidewall.

5. The flexible grounding strip according to claim 1, wherein:

the series of lengthwise-spaced slots are arranged so that slots extending at least partly across the base from one sidewall alternate with the slots extending at least partly across the base from the opposed sidewall.

6. A computer system comprising:

a grounded component having a rib comprising a first surface and an opposed second surface connected by a first edge;

an ungrounded component disposed adjacent to the second surface of said grounded component;

an elongated grounding strip installed on the rib, wherein said strip comprises a base extending along the first surface, a sidewall extending along the first edge, and a flange extending along the second surface and in contact with both said grounded component and said ungrounded component; and a series of lengthwise-spaced slots extending through said strip widthwise across the sidewall and at least partly across the base, wherein the slot dimensions and spacing imparting flexibility to enable the strip to bend transversely of its length.

7. The computer system of claim 6, wherein:

the rib of said grounded component comprises a second edge such that the first and second surfaces connect the first edge to the second edge;

said strip comprises a second sidewall extending along the second edge and a second flange extending along the second surface and in contact with both said grounded component and said ungrounded component; and a series of lengthwise-spaced slots extending through said strip widthwise across the second sidewall and at least partly across the base, wherein the slot dimensions and spacing imparting flexibility to enable the strip to bend transversely of its length.

8. The computer system of claim 7, wherein:

the base, sidewalls, and flanges of the flexible grounding strip comprise a one-piece strip.

9. The computer system according to claim 7, wherein:

the series of lengthwise-spaced slots are arranged so that slots extending at least partly across the base from one sidewall are disposed between slots extending at least partly across the base from the opposed sidewall.

10. The computer system according to claim 7, wherein:

the series of lengthwise-spaced slots are arranged so that slots extending at least partly across the base from one sidewall alternate with the slots extending at least partly across the base from the opposed sidewall.

11. The computer system according to claim 6, wherein:

the grounded component comprises an input/output backplane.

12. The computer system according to claim 6, wherein:

the ungrounded component comprises a peripheral component interface board.

13. The computer system according to claim 6, wherein:

the ungrounded component comprises a printed circuit board.

14. A method of maintaining an electrical connection between a first and second component in an electronic device comprising:

installing a flexible grounding strip between the first and second component, wherein the flexible grounding strip comprises:

an elongated electrically conductive strip having a base extending between spaced, opposed sidewalls, each of the sidewalls having a flange spaced from the base and extending towards the opposed sidewall, wherein the flange contacts the first and second components;

each of the sidewalls having a series of lengthwise-spaced slots extending widthwise across the sidewall into and at least partly across the base towards the opposed sidewall;

the slot dimensions and spacing imparting flexibility to enable the strip to bend transversely of its length.

15. The method according to claim 14, wherein:

the series of lengthwise-spaced slots are arranged so that slots extending at least partly across the base from one sidewall are disposed between slots extending at least partly across the base from the opposed sidewall.

16. The method according to claim 14, wherein:

the series of lengthwise-spaced slots are arranged so that slots extending at least partly across the base from one sidewall alternate with the slots extending at least partly across the base from the opposed sidewall.

17. The method according to claim 14, wherein:

the first component is an input/output backplane in a computer and the second component is a component capable of being attached to the input output backplane; and the flexible grounding strip is installed by bending the strip transversely while sliding one end of the flexible grounding strip onto a section of the input/output backplane; and the flexible grounding strip returns to a generally linear shape after installation.

18. The method of claim 14, wherein:

a gap exists between the first component and the second, said gap varying in distance along the length of the input/output backplane, wherein the flexible grounding strip is installed within the gap.

19. The method of claim 14, wherein:

there are no portions of the flexible grounding strip that extend beyond the first or second components.

* * * * *